United States Patent
Dao (10) Patent No.: US 12,047,072 B2
(45) Date of Patent: Jul. 23, 2024

(54) SYSTEM AND METHOD FOR REDUCING CIRCUIT ELEMENTS IN HIGH-PERFORMANCE FLIP-FLOPS

(71) Applicant: Steve Dao, Houston, TX (US)

(72) Inventor: Steve Dao, Houston, TX (US)

( * ) Notice: Subject to any disclaimer, the term of this patent is extended or adjusted under 35 U.S.C. 154(b) by 0 days.

(21) Appl. No.: 17/739,136

(22) Filed: May 8, 2022

(65) Prior Publication Data

US 2023/0412152 A1    Dec. 21, 2023

(51) Int. Cl.
  *H03K 3/012*    (2006.01)
  *H03K 3/3562*   (2006.01)

(52) U.S. Cl.
  CPC ......... *H03K 3/012* (2013.01); *H03K 3/35625* (2013.01)

(58) Field of Classification Search
  CPC . H03K 3/00; H03K 3/01; H03K 3/011; H03K 3/012; H03K 3/013; H03K 3/02; H03K 3/027; H03K 3/037; H03K 3/0372; H03K 3/0375; H03K 3/0377
  See application file for complete search history.

(56) References Cited

U.S. PATENT DOCUMENTS 6,278,308 B1 * 8/2001 Partovi ............ H03K 3/356139
                                             327/210
7,301,373 B1    11/2007 Bailey

\* cited by examiner

*Primary Examiner* — Diana J. Cheng
(74) *Attorney, Agent, or Firm* — Lisa Foundation Patent Law Clinic; Qiguang Pan (57) ABSTRACT

A latch circuit comprising a tristate driver and a storage feedback loop and having minimal circuit elements is disclosed. The tristate driver and feedback loop couple to internal nodes of a separate latch circuit to reduce total circuit element count by collapsing elements with common functionality into a single circuit element. The latch circuit presents only one transistor gate load to a clock signal, and the output of the separate latch is coupled to the input of the latch circuit to form a flip-flop. The flip-flop generates an output signal based on a received input signal when the clock signal is at second level and stores the received input signal when the clock signal is at first level. The flip-flop is fully static, contention-free, with near-zero setup time, with less circuit elements than prior arts, and can be configured to integrate multi-input logic functions.

20 Claims, 10 Drawing Sheets

SYSTEM AND METHOD FOR REDUCING CIRCUIT ELEMENTS IN HIGH-PERFORMANCE FLIP-FLOPS

BACKGROUND

1. Field of Invention

The invention described herein generally pertain to the field of flip-flop circuits, and more particularly, to flip-flop devices with low power consumption, low latency, and low hold-time characteristics, and to the manner of making and using the same or components thereof.

2. Description of Related Art

Flip-flops are clocked storage elements that are ubiquitous throughout synchronous digital VLSI systems such as CPUs (Central Processing Unit), GPUs (Graphics Processing Unit), SOCs (System On Chip), and IoT (Internet of Things). Highly pipelined microprocessors use flip-flops in each pipeline stage to divide the processing logic for higher performance gains. A flip-flop generally comprises of a first latch "master" coupled to a second latch "slave". The master latch is transparent when clock signal is at first level (low) and samples the main input signal. The master latch is opaque when clock signal is at second level (high) and blocks any changes in the main input signal from propagating to the slave latch. The output of the master latch is the input to the slave latch. The slave latch is active when the clock signal transitions to second level and generates an output signal depending on the level of the sampled main input signal from the master latch. The slave latch stores the sampled main input signal onto an internal storage node and maintains a stable output signal when the clock signal is at first level. Hence, this describes the operation of a prior art from FIG. 1.

A high-performance synchronous digital system like a microprocessor requires flip-flops with low latency to improve throughput. If the latency consumes a large portion of the timing budget, the effects of pipelining to increase throughput is diminished. Two chief components affecting the latency are the setup time and clk-Q propagation delay. A low-latency flip-flop should have minimal setup time and minimal clk-Q propagation delay. Setup time is the time the data input signal must be stable prior to the rising edge of the clock signal. Often, designing a flip-flop with minimal setup-time comes at a cost of higher power consumption as the flip-flop may contain more circuit elements, occupy greater silicon area, present a greater burden on the clock network, and have more internal nodes toggling even when the main input signal is constant.

So as to reduce the complexity and length of the Detailed Specification, and to fully establish the state of the art in certain areas of technology, Applicant(s) herein expressly incorporate(s) by reference all of the following materials identified in each numbered paragraph below.

U.S. Pat. No. 7,301,373 B1 may generally concern a flip flop device with a differential stage coupled to a latch stage. This device uses more circuit elements than is necessary, increasing the power consumption and load on the clock.

Applicant(s) believe(s) that the material incorporated above is "non-essential" in accordance with 37 CFR 1.57, because it is referred to for purposes of indicating the background of the invention or illustrating the state of the art. However, if the Examiner believes that any of the above-incorporated material constitutes "essential material" within the meaning of 37 CFR 1.57(c)(1)-(3), Applicant(s) will amend the specification to expressly recite the essential material that is incorporated by reference as allowed by the applicable rules.

SUMMARY

The present invention provides among other things a system and method for reducing the number of elements in a high-performance flip-flop. The flip-flop circuit comprises of an input propagation unit coupled to a latch. The input propagation unit further comprises of a first and second stack structure, a first and second top node, a first and second bottom node, and a first and second keeper device. The first and second stack structures have a clock-activated transistor at the top-most position of the stack to reduce the number of intermediate nodes within the stack structures from toggling when the main input signal is constant. The first and second keeper devices are activated upon discharging of the first and second stack structures and do not depend on the main input signal to change. The first keeper device is further clock-gated by a first clock-activated transistor at the top-most position of the first stack structure to avoid contention with a precharge transistor when the clock signal transitions from second level to first level.

The method to reduce circuit elements is applied to the latch to remove transistors with common functionality, and thereby the latch shares nodes with the input propagation unit. The latch comprises of a tristate driver to write the sampled input signal to a storage node when the clock signal is at second level and a keeper sub-circuit to retain the state of the storage node when the clock signal is at first level. The tristate driver and keep sub-circuit are coupled to the first or second top node and to the first or second bottom node of the input propagation unit to merge elements with common functionality. To this end, the latch has at most one clock-activated transistor element.

The input propagation unit samples a data bit on a main input signal when a clock signal transitions from first level to second level and after sampling the data bit, the input propagation unit blocks propagation of subsequent changes to the main input signal while the clock signal remains at second level. Depending on the level of the main input signal, either the first stack structure discharges or the second stack structure discharges when the clock signal transitions from first level to second level. A sampled data bit with high logic value is propagated to the latch upon discharging of the first stack structure and a sampled data bit with a low logic value is propagated to the latch upon discharging of the second stack structure when the clock signal transitions from first level to second level. The latch generates an output signal upon receiving the sampled data bit from the input propagation unit when the clock signal is at second level, and the latch stores the received data bit onto an internal storage node when the clock signal is at first level. The configuration of the input propagation unit to sample a data bit using the stack structures permits the arrival of the data edge simultaneously with the clock edge, and therefore, no setup time is required by the flip-flop circuit.

In another embodiment, the flip-flop circuit is contemplated with an output signal of same polarity as the main input signal. In an additional embodiment, the method to reduce circuit elements is applied to a prior art. In yet another embodiment, the flip-flop circuit is contemplated to incorporate multi-input logic into the first and second stack structures. The contemplated flip-flop circuit still requires no setup time despite the additional embedded circuitry. The contemplated flip-flop circuit offers a promising solution to address setup time violations without increasing total area or power consumption of a synchronous digital system.

Aspects and applications of the invention presented here are described below in the drawings and detailed description of the invention. Unless specifically noted, it is intended that the words and phrases in the specification and the claims be given their plain, ordinary, and accustomed meaning to those of ordinary skill in the applicable arts. The inventor is fully aware that he can be his own lexicographer if desired. The inventor expressly elects, as his own lexicographers, to use only the plain and ordinary meaning of terms in the specification and claims unless he clearly states otherwise and then further, expressly sets forth the "special" definition of that term and explains how it differs from the plain and ordinary meaning. Absent such clear statements of intent to apply a "special" definition, it is the inventor's intent and desire that the simple, plain and ordinary meaning to the terms be applied to the interpretation of the specification and claims.

The inventor is also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventor is fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for, and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventor not to invoke the provisions of 35 U.S.C. § 112(f). Moreover, even if the provisions of 35 U.S.C. § 112(f) are invoked to define the claimed inventions, it is intended that the inventions not be limited only to the specific structure, material or acts that are described in the preferred embodiments, but in addition, include any and all structures, materials or acts that perform the claimed function as described in alternative embodiments or forms of the invention, or that are well known present or later-developed, equivalent structures, material or acts for performing the claimed function.

The foregoing and other aspects, features, and advantages will be apparent to those artisans of ordinary skill in the art from the DETAILED DESCRIPTION and DRAWINGS, and from the CLAIMS.

BRIEF DESCRIPTION OF THE SEVERAL
VIEWS OF THE DRAWINGS

A more complete understanding of the present invention may be derived by referring to the detailed description when considered in connection with the following illustrative figures. In the figures, like reference numbers refer to like elements or acts throughout the figures.

Elements and acts in the figures are illustrated for simplicity and have not necessarily been rendered according to any particular sequence or embodiment.

DETAILED DESCRIPTION

In the following description, and for the purposes of explanation, numerous specific details are set forth in order to provide a thorough understanding of the various aspects of the invention. It will be understood, however, by those skilled in the relevant arts, that the present invention may be practiced without these specific details. In other instances, known structures and devices are shown or discussed more generally in order to avoid obscuring the invention. In many cases, a description of the operation is sufficient to enable one to implement the various forms of the invention, particularly when the operation is to be implemented in software. It should be noted that there are many different and alternative configurations, devices and technologies to which the disclosed inventions may be applied. The full scope of the inventions is not limited to the examples that are described below.

Metal-Oxide Semiconductor Field-Effect Transistor (MOSFET) describes a type of transconductive device that may be used in modern Very Large Scale Integrated (VLSI) systems. MOSFETs are designed as one of two basic types, n-channel and p-channel. N-channel MOSFETs open a conductive path between the source and drain when a positive voltage greater than the device's threshold voltage ($V_T$) is applied from the gate to the source. P-channel MOSFETs open a conductive path when a voltage greater than the device's threshold voltage is applied from the source to the gate. Complimentary MOSFET (CMOS) describes a circuit designed with a mix of n-channel and p-channel MOSFETs. In CMOS designs, n-channel and p-channel may be arranged such that a second level on the gate of a MOSFET turns a n-channel device on (opens a conductive path), and turns a p-channel MOSFET off (closes conductive path). Conversely, a first level on the gate of a MOSFET turns a p-channel on and a n-channel off. While CMOS logic is used in the examples, it is noted that any suitable digital logic process may be used for the circuits described in this disclosure. Furthermore, all drawings depict n-channel and p-channel MOSFETs as three terminal devices comprising of drain, gate, and source unless stated otherwise. The fourth terminal being the body substrate is assumed to be coupled to low-power supply for n-channel and high-power supply for p-channel unless stated otherwise.

Figure 1:
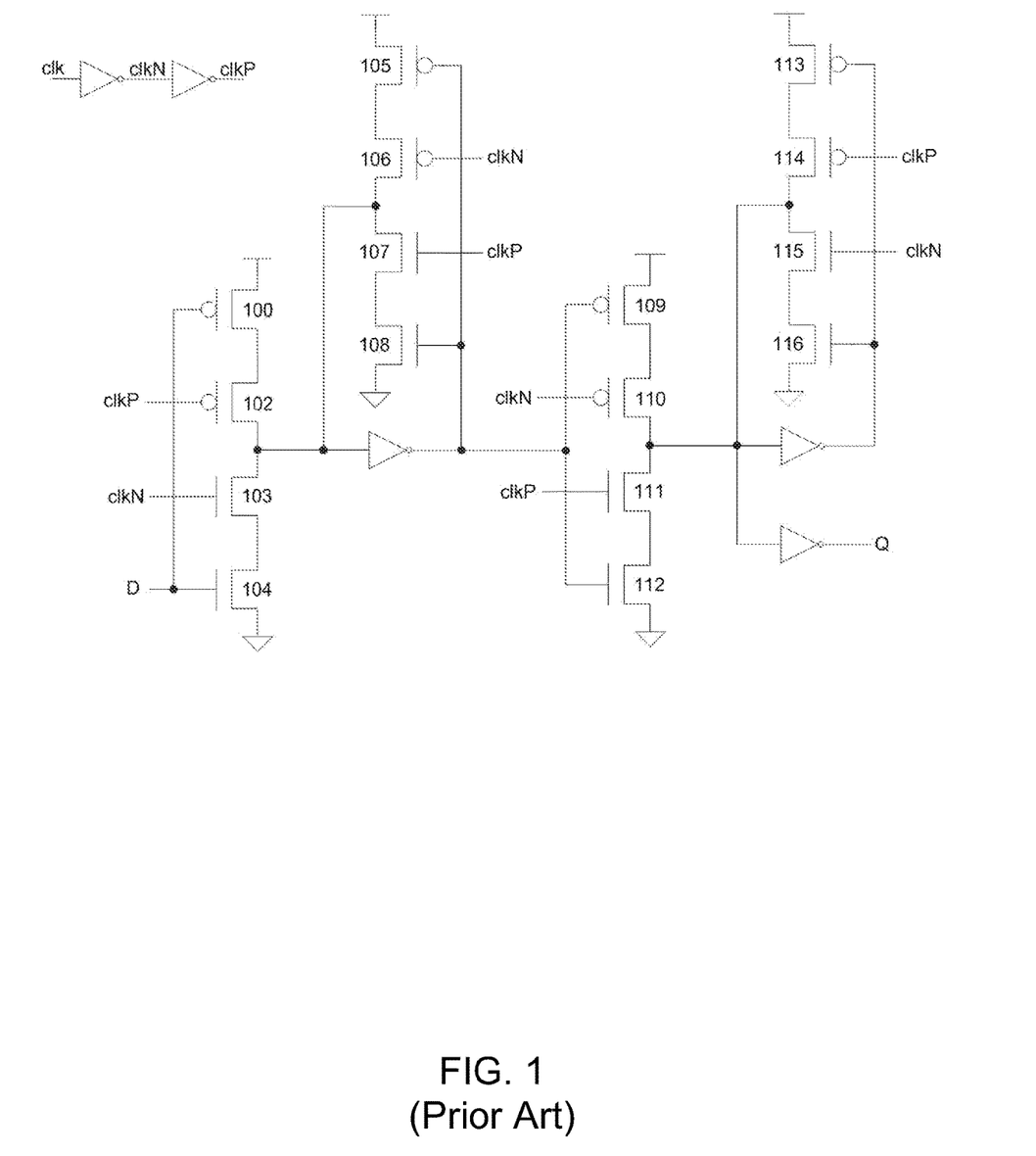
FIG. 1 depicts a prior art flip-flop circuit.

FIG. 1 illustrates a conventional flip-flop of a prior art. The conventional flip-flop is ubiquitous in the design of synchronous digital systems. The conventional flip-flop is a fully-static circuit with adequate noise immunity, has relatively fast clk-Q propagation delay, and occupies a relatively small silicon footprint. However, the conventional flip-flop requires inverters on the clock signal clk to operate the master latch on a different phase than the slave latch, and has a prodigious number of transistors coupled to the clock network. Each conventional flip-flop presents a 12-transistor gate load to the clock network. Some internal nodes also toggle every clock cycle even when the main input signal D is constant. The conventional flip-flop also has a finite setup time requirement. The main input signal D must arrive some setup time prior to the rising edge of the clock signal clk in order for the master latch to propagate the sampled data bit onto the slave latch.

Figure 2:
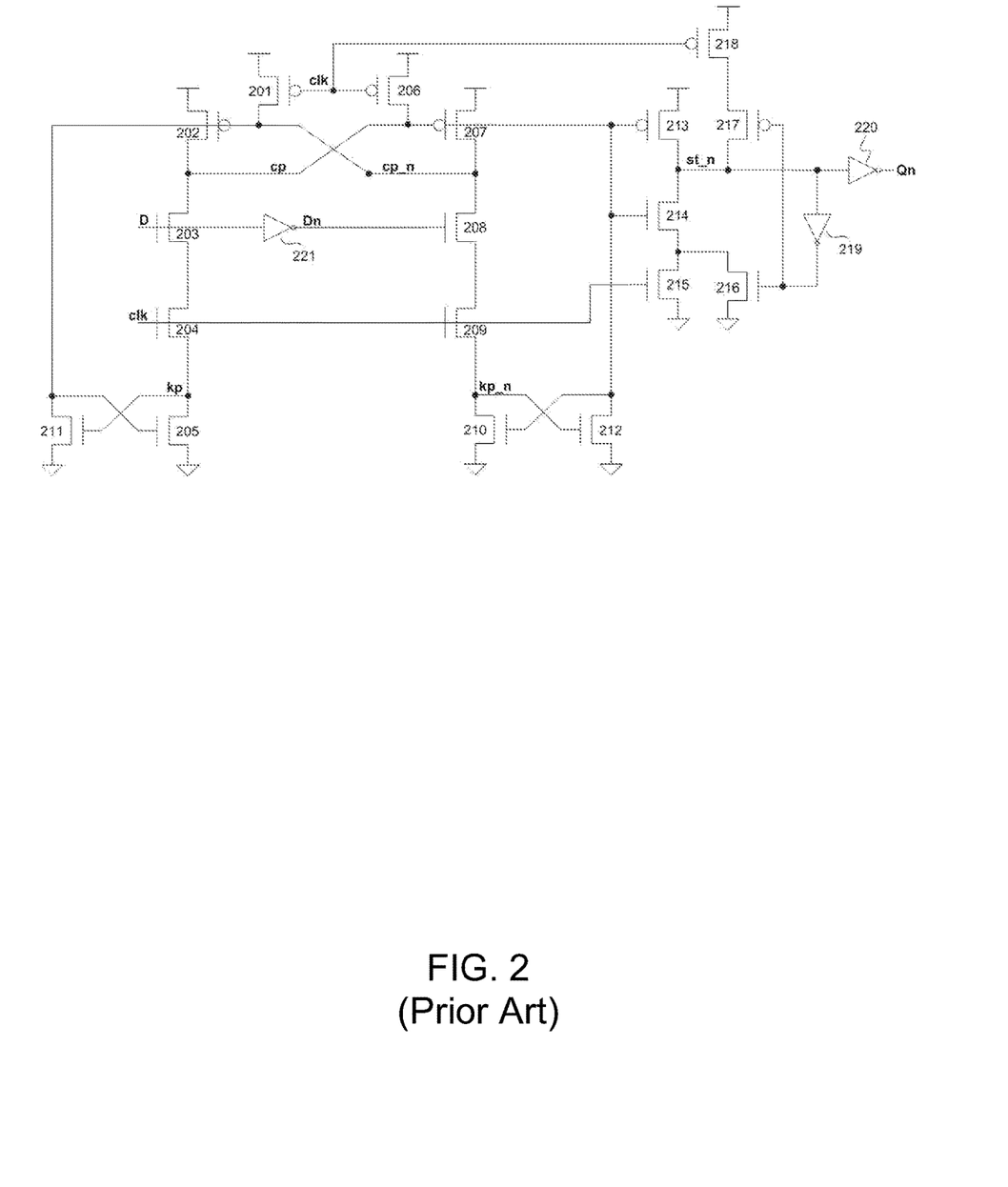
FIG. 2 depicts another prior art flip-flop circuit.

FIG. 2 illustrates a prior art with a flip-flop circuit based on reordering the input transistors of a sense-amplifier flip-flop. The flip-flop circuit of FIG. 2 comprises of a differential stage and a latch stage where the differential stage has input ordering of data transistor at the top-most position, clock transistor at the middle-most position, and foot transistor at the bottom-most position. A traditional sense-amplifier flip-flop has input ordering of foot transistor at the top-most position, data transistor at the middle-most position, and clock transistor at the bottom-most position. Transistors 203 and 208 of FIG. 2 are the data transistors at the top-most position of the stack. During the precharge phase when clock signal is at first level and the input signal D is constant, the intermediate node between the data and clock transistors is precharged along with nodes cp and cp_n. During the evaluate phase when clock signal is at second level, the precharged intermediate node is discharged along with either cp or cp_n. When multi-input logic involving series-coupled NFETs is incorporated into the data transistor stage, more intermediate nodes are precharged and discharged every clock cycle if the multi-inputs remain constant. The flip-flop circuit of FIG. 2 consumes more dynamic power with this configuration. Transistors 211 and 212 are keeper devices to maintain node cp or cp_n at first level should the input signal D change while clock signal is at second level. The drain terminal of transistor 211 is coupled to node cp_n while the drain terminal of transistor 212 is coupled to node cp. As an example if input signal D changes from second level to first level after cp discharges to low-power supply while the clock signal remains at second level, transistor 212 is activated to provide node cp with a secondary low-impedance path to low-power supply. When the differential stage enters the precharge phase as the clock signal transitions to first level, transistor 212 still maintains a conductive channel coupling node cp to low-power supply albeit the gate terminal of transistor 212 is driven by a floating "weak high" value. This active conductive channel at the onset of the precharge phase must be overcome by precharge transistor 206 before charging node cp to second level. This momentary contention results in added power consumption. Furthermore, both transistors 211 and 212 are activated by two series-coupled NFET transistors when the input signal D changes while clock signal is at second level. Two series-coupled NFETs conduct a deteriorated ($V_{DD}$-$V_T$) voltage value to the gate terminals of transistors 211 and 212, which becomes problematic for the flip-flop circuit of FIG. 2 to be implemented at low voltage domains. If multi-input logic involving a chain of series-coupled NFETs is incorporated into the differential stage, reliable activation of the keeper devices across process corners becomes a concern. Lastly, the latch stage of FIG. 2 does not merge circuit elements with common functionality into one element, and thereby requires two clock-activated transistors in the latch stage which further burdens the clock signal.

In view of the foregoing prior arts, there is a need to provide a flip-flop design, which reduces power consumption and silicon area by reducing the total element count via collapsing elements with common functionality into a single circuit element without sacrificing performance.

Figure 3:
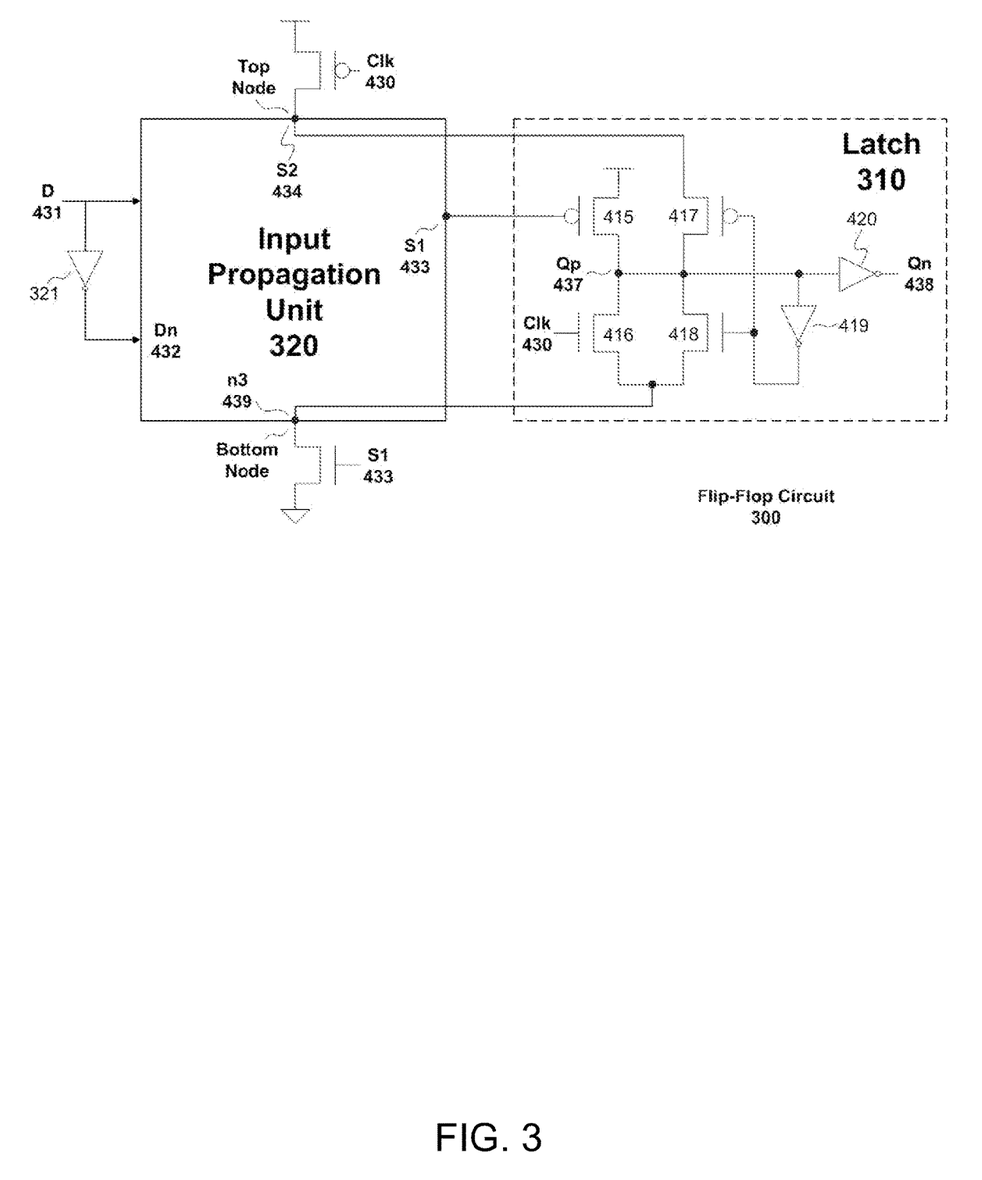
FIG. 3 depicts the connectivity diagram for an embodiment of a flip-flop circuit.

The present invention provides among other things a system and method for a flip-flop circuit. FIG. 3 shows a block diagram of the invention of FIG. 4. The flip-flop circuit 300 of FIG. 3 includes an input propagation unit 320 coupled to a latch 310. FIG. 3 includes the principal connectivity between the input propagation unit 320 and latch 310 and shows the shared nodes between the input propagation unit 320 and latch 310. The inputs to the input propagation unit 310 are the main input signal D 431 and clock signal Clk 430. The output of the input propagation unit 310 is a first top node S1 433 and is the first input to the latch 310. The clock signal Clk 430 is the second input to the latch 310. The output of the flip-flop circuit 300 is the output signal Qn 438. Inverter 321 generates an inverted main input signal Dn 432 to the input propagation unit 310. The first top node S2 434 is a shared node with the source terminal of transistor 417 from latch 310. Both the source terminals of transistors 416 and 418 from latch 310 are coupled to a shared second bottom node n3 439 of the input propagation unit 320.

Figure 4:
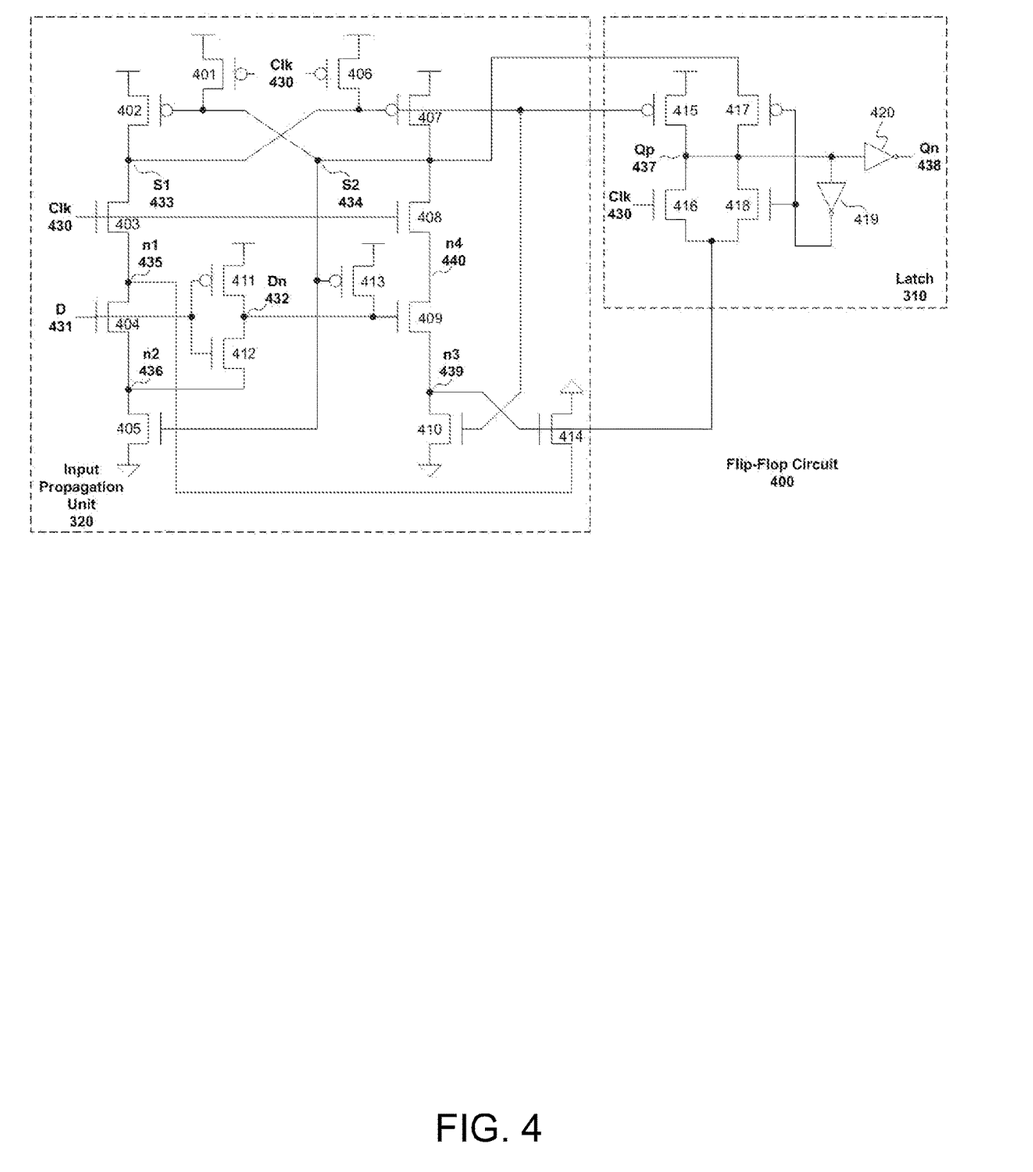
FIG. 4 depicts an embodiment of a flip-flop circuit.

Referring now to the invention of FIG. 4, the flip-flop circuit 400 comprises of an input propagation unit 320 and a latch 310. The input propagation unit 320 comprises of transistors 401 to 414. The sub-units of the input propagation unit 320 are the first and second stack structures, first and second keeper devices, first and second top nodes, first and second bottom nodes, a P-sub-circuit, and a main input inverter. The first stack structure is comprised of transistors 403, 404, 405, and the second stack structure is comprised of transistors 408, 409, 410. The first keeper device is transistor 414, and the second keeper device is transistor 413. The first top node is S1 433, and the second top node is S2 434. The first bottom node is n2 436, and the second bottom node is n3 439. The P-sub-circuit is comprised of transistors 401, 406, 402, 407. The main input inverter is comprised of transistors 411 and 412. Transistor 403 is the first clock-activated transistor and positioned as the first top-most transistor of the first stack structure. Transistor 408 is the second clock-activated transistor and positioned as the second top-most transistor of the second stack structure. Transistor 404 is the first data transistor and positioned as the first middle-most transistor of the first stack structure. Transistor 409 is the second data transistor and positioned as the second middle-most transistor of the second stack structure. Transistor 405 is the first foot transistor and positioned as the first bottom-most transistor of the first stack structure. Transistor 410 is the second foot transistor and positioned as the second bottom-most transistor of the second stack structure.

The connectivity of the input propagation unit 310 is now described. For the first stack structure, the drain terminal of transistor 403 is coupled to the first top node S1 433, and the source terminal is coupled to an intermediate node n1 435. The drain terminal of transistor 404 is coupled to intermediate node n1 435, and the source terminal is coupled to the first bottom node n2 436. The drain terminal of transistor 405 is coupled to the first bottom node n2 436, and the source terminal is coupled to low-power supply. For the second stack structure, the drain terminal of transistor 408 is coupled to the second top node S2 434, and the source terminal is coupled to the drain terminal of transistor 409. The source terminal of transistor 409 is coupled to the second bottom node n3 439. The drain terminal of transistor 410 is coupled to the second bottom node n3 439, and the source terminal is coupled to low-power supply. For the first keeper device, the drain terminal of transistor 414 is coupled to the intermediate node n1 435, the source terminal is coupled to low-power supply, and the gate terminal is coupled to the second bottom node n3 439. For the second keeper device, the drain terminal of transistor 413 is coupled to the gate terminal of transistor 409, the source terminal is coupled to high-power supply, and the gate terminal is coupled to the second top node S2 434. For the P-sub-circuit, the drain terminal of transistor 401 is coupled to the second top node S2 434, the source terminal is coupled to high-power supply, and the gate terminal is coupled to the clock signal Clk 430. The drain terminal of transistor 406 is coupled to the first top node S1 433, the source terminal is coupled to high-power supply, and the gate terminal is coupled to the clock signal Clk 430. The drain terminal of transistor 402 is coupled to the first top node S1 433, the source terminal is coupled to high-power supply, and the gate terminal is coupled to second top node S2 434. The drain terminal of transistor 407 is coupled to the second top node S2 434, the source terminal is coupled to high-power supply, and the gate terminal is coupled to the first top node S1 433. For the main input inverter, the drain terminal of transistor 411 is coupled to the gate terminal of transistor 409, the source terminal is coupled to high-power supply, and the gate terminal is coupled to the main input signal D 431. The drain terminal of transistor 412 is coupled to the gate terminal of transistor 409, the source terminal is coupled to the first bottom node n2 436, and the gate terminal is coupled to the main input signal D 431. The gate terminal of transistor 409 is coupled to the inverted main input signal Dn 432. The clock signal Clk 430 is coupled to the gate terminals of transistors 403, 408, 401, and 406. The main input signal D 431 is coupled to the gate terminal of transistor 404. The output of the input propagation unit 320 is the first top node S1 433.

Latch 310 comprises of transistors 415 to 418, storage node Qp 437, inverter 419, and output buffer 420. The tristate driver comprises of transistors 415 and 416. Transistor 416 is the third-clock activated transistor and forms the pull-down network of the tristate driver. The keeper sub-circuit comprises of transistors 417 and 418. Transistor 417 is the pull-up transistor of the keeper sub-circuit, and transistor 418 is the pull-down transistor of the keeper sub-circuit. The drain terminal of transistor 415 is coupled to the storage node Qp 437, and the source terminal is coupled to high-power supply. The drain terminal of transistor 416 is coupled to storage node Qp 437, and the source terminal is coupled to the source terminal of transistor 418. The drain terminal of transistor 418 is coupled to storage node Qp 437. Both source terminals of transistors 416 and 418 are coupled to a shared node between the input propagation unit 320 and latch 310 via the second bottom node n3 439. The drain terminal of transistor 417 is coupled to storage node Qp 437, and the source terminal is coupled to the second top node S2 434 of the input propagation unit 320. Transistor 417 is coupled to shared node between the input propagation unit 320 and latch 310 via the second top node S2 434. The input of inverter 419 is coupled to storage node Qp 437, and the output of inverter 419 is coupled to the gate terminals of transistors 417 and 418. The input of output buffer 420 is coupled to storage node Qp 437, and the output of output buffer 420 is the output signal Qn 438. The first input to the tristate driver is coupled to the output of the input propagation unit 320, and is coupled to the gate terminal of transistor 415. The second input to the tristate driver is coupled to the clock signal Clk 430, and is coupled to the gate terminal of transistor 416.

The operation of the flip-flop circuit 400 is now described. In the embodiment of FIG. 4, the flip-flop circuit 400 receives a main input signal D 431 and a clock signal Clk 430 and generates an output signal Qn 438. When clock signal Clk 430 is at low first level, first top node S1 433 and second top node S2 434 are charged to high second level by transistors 401 and 406. First bottom node n2 436 and second bottom node n3 439 are discharged to first level by transistors 405 and 410. Transistors 402 and 407 are deactivated during clock signal Clk 430 at low level. When main input signal D 431 is at second level and clock signal Clk 430 transitions from first level to second level, transistors 403 and 404 are activated and the first top node S1 433 is discharged to first level by the first stack structure. Transistor 410 is deactivated and prevents the second stack structure from discharging, thereby blocking changes in the main input signal D 431 from propagating to the latch. The second top node S2 434 remains at second level held by transistor 407 activated upon the discharging of the first top node S1 433 to first level. Transistor 415 of the tristate driver is activated to charge storage node Qp 437 to second level, thereby, outputting a low first level at the output signal Qn 438. Furthermore, transistor 416 of the tristate driver is activated and conducts a voltage level of $(V_{DD}-V_T)$ to activate the first keeper device of transistor 414. Should the main input signal D 431 change from second level to first level during clock signal Clk 430 at second level, an alternative low-impedance path for first top node S1 433 to low-power supply via transistors 403 and 414 is provided to avoid the first top node S1 433 from being in a dynamic floating state.

Conversely, when main input signal D 431 is at first level and clock signal Clk 430 transitions from first level to second level, transistors 408 and 409 are activated and the second top node S2 434 is discharged to first level by the second stack structure. Transistor 405 is deactivated and prevents the first stack structure from discharging, thereby blocking changes in the main input signal D 431 from propagating to the latch. The first top node S1 433 remains at second level held by transistor 402 activated upon the discharging of the second top node S2 434 to first level. Transistor 415 of the tristate driver remains deactivated, and transistor 416 discharges storage node Qp 437 to first level via transistor 410, thereby, outputting a high second level at the output signal Qn 438. Furthermore, transistor 413 is activated upon the discharging of the second top node S2 434, and thereby maintaining the activation of transistor 409. Should the main input signal D 431 change from first level to second level during clock signal Clk 430 at second level, the low-impedance path to low-power supply via transistors 408, 409, 410 is still maintained, and prevents the second top node S2 434 from being in a dynamic floating state. When transistor 413 is activated and the main input signal 431 changes from first level to second level, the inverted main input signal Dn 432 is delayed from discharging to first level until clock signal Clk 430 transitions to first level to avoid contention between transistors 412 and 413.

Coupling the source terminal of transistor 412 to the first bottom node n2 436 prevents the contention. The activation of the first or second keeper device occurs upon the discharging of the first or second stack structures and does not depend on if the main input signal D 431 changes.

When the clock signal Clk 430 is at second level, the tristate driver of latch 310 writes to the storage node Qp 437 based on the level of the output of the input propagation unit 320. If the top node S 433 is at first level, a second level value is written by transistor 415 to the storage node Qp 437. If the top node S 433 is at second level, a first level value is written by transistor 416 to the storage node Qp 437. When the clock signal 430 is at second level, the keeper sub-circuit does not interfere with the write operation. If a first level value is written to storage node Qp 437, transistors 416 and 410 provide a low-impedance path to low-power supply. Transistor 418 is activated and provides storage node Qp 437 with additional low-impedance path to low-power supply via transistor 410 and therefore, no contention occurs. Conversely, if a second level value is written to storage node Qp 437, transistor 415 provides a low-impedance path to high-power supply. Transistor 417 is activated and provides storage node Qp 437 with additional low-impedance path to high-power supply via transistor 407 and therefore, still no contention occurs.

When the clock signal Clk 430 is at first level, the tristate driver of latch 310 is deactivated, and the storage node Qp 437 is held at first or second level by the keeper sub-circuit. The keeper sub-circuit is activated upon the clock signal Clk 430 transitioning to first level. If the storage node Qp 437 stores a first level value, transistor 418 is activated to provide a low-impedance path to low-power supply via transistor 410 to hold storage node Qp 437 at first level. Transistors 407 and 401 are deactivated to block the second top node S2 434 from high-power supply to avoid contention. If the storage node Qp 437 stores a second level value, transistor 417 is activated to provide a low-impedance path to high-power supply via transistor 401 to hold storage node Qp 437 at second level. Transistor 408 is deactivated by the clock signal Clk 430 to block the second top node S2 434 from low-power supply in order to avoid contention.

The lack of contention at the second top node S2 434 allows for the collapsing of elements with common functionality into a single circuit element between the input propagation unit 320 and the latch 310. Therefore, the source terminal of transistor 417 is coupled to the drain terminal of transistor 401 to eliminate a transistor in the pull-up network of the keeper sub-circuit. Likewise, the source terminal of transistor 418 is coupled to the drain terminal of transistor 410 to eliminate a transistor in the pull-down network of the keeper sub-circuit. Furthermore, the source terminal of transistor 416 is coupled to the drain terminal of transistor 410 to eliminate a transistor in the pull-down network of the tristate driver. The reduction in circuit element improves power performance without degradation in speed performance of the flip-flop circuit. In summary, both the second top node S2 434 and the bottom node n3 439 from the input propagation unit 320 are shared with the latch 310.

The role of the first and second keeper devices are to ensure the first top node S1 433 and second top node S2 434 have an uninterrupted low-impedance path to low-power supply if the main input signal D 431 changes while the clock signal Clk 430 is at second level. Transistor 414 of the first keeper device is coupled to intermediate node n1 435 to be clock-gated by transistor 403 to avoid contention with the first top node S1 433 when the clock signal Clk 430 transitions to first level. When transistor 414 is activated by transistor 416 upon the discharging of the first stack structure, the position of transistor 403 as top-most transistor of the first stack disables the pull-down path of transistor 414 from the pull-up path of transistor 406 as the clock signal Clk 430 transitions to first level. Therefore, transistor 406 does not have to be sized to overcome transistor 414 during the precharge period of the clock. Consequently, a contention-free circuit is insensitive to process variations as the circuit functionality does not depend on the sizing relationships between transistors. The flip-flop circuit 400 has noise immunity and fully-static operation when the gate terminal of transistors are not coupled to floating nodes.

Figure 5:
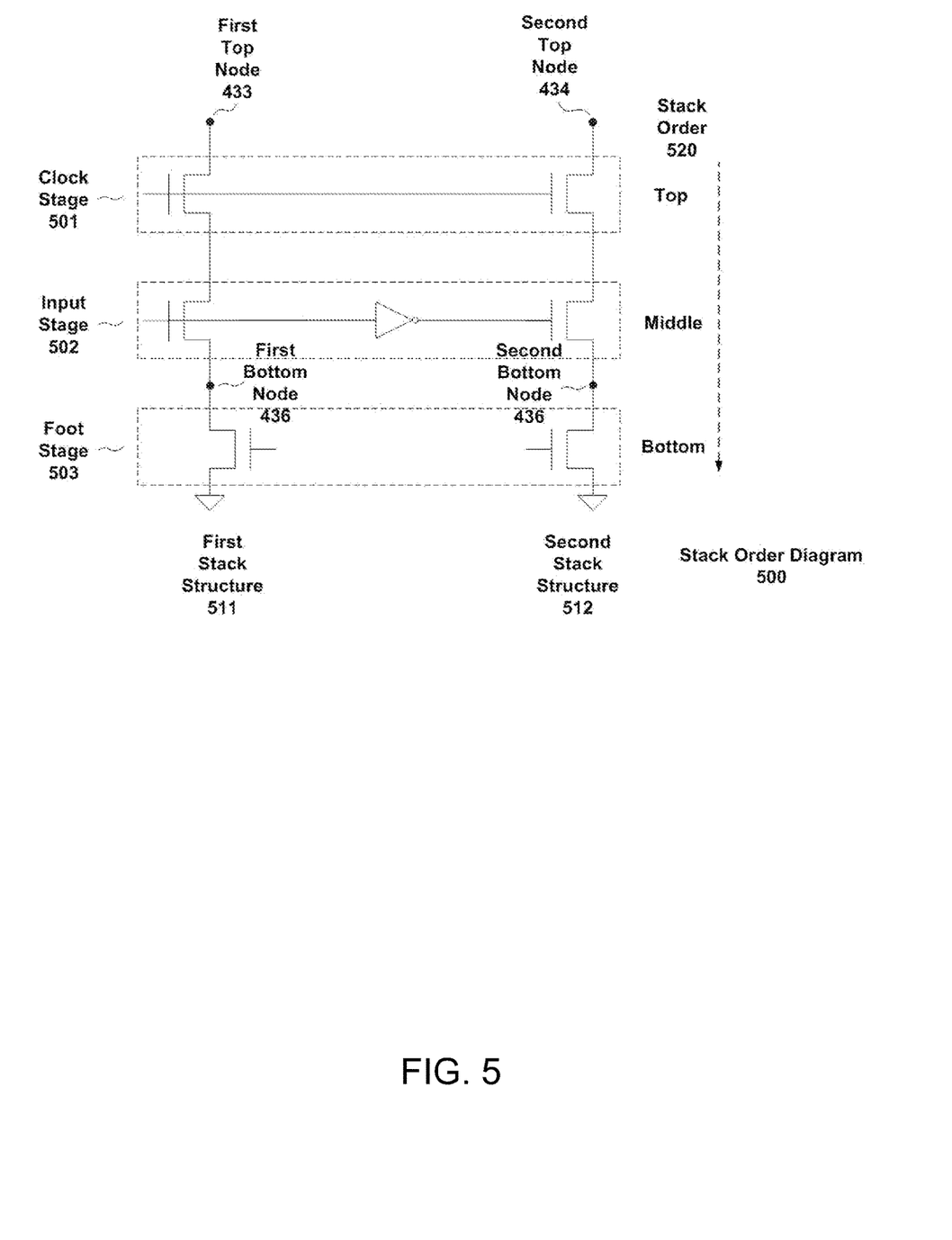
FIG. 5 depicts the input order diagram for an embodiment of a flip-flop circuit.

FIG. 5 illustrates the transistor positions in the first and second stack structures. In both stack structures, the clock stage 501 is at the top-most position coupled to the top nodes, followed by the input stage 502 at the middle-most position, and the foot stage 503 at the bottom-most position coupled to the bottom nodes. Transistor 403 is the first clock-activated transistor coupled to the first top node S1 433. Transistor 408 is the second clock-activated transistor coupled to the second top node S2 434. Transistor 404 is the first data transistor, and transistor 409 is the second data transistor. Transistor 405 is the first foot transistor coupled to the first bottom node n2 436. Transistor 410 is the second foot transistor coupled to the second bottom node n3 439. The first foot transistor 405 is activated by second top node S2 434 and the second foot transistor 410 is activated by first top node S1 433 when the clock signal Clk 430 is at first level. Therefore, both first and second bottom nodes are discharged to low-power supply before clock signal Clk 430 transitions to second level, thereby, improving the clk-Q delay of the flip-flop circuit 400 as only the clock-activated and data transistors need to be discharged during the evaluate period of the clock. Clock-activated transistors 403 and 408 being at the top-most position eliminate charge sharing issues during the precharge period of the clock as the first and second top nodes are electrically separated from the intermediate nodes of the stack structures. Furthermore, clock-activated transistors 403 and 408 being at the top-most position prevent the intermediate nodes n1 435 and n4 440 from toggling every clock cycle when the main input signal D 431 is constant. As an example, if transistor 404 is in the top-most position and transistor 403 is in the middle-most position and the main input signal D 431 is constant at second level, intermediate node n1 435 precharges to second level and discharges to first level every clock cycle. If the input stage 502 of FIG. 5 has multi-input logic functions and with the clock stage 501 at the top-most position, the intermediate nodes within the logic tree do not toggle every clock cycle when the multi-inputs are constant. Therefore, the flip-flop circuit 400 has reduced dynamic power consumption when the top-most position of the stack structure is the clock-activated transistor. As mentioned previously, the clock-activated transistors occupying the top-most position provides an activated first keeper device 414 with clock-gating to avoid contention with transistor 406 when the clock signal Clk 430 transitions from second level to first level. Lack of contention further improves power efficiency as the keeper devices and precharge transistors are of minimum size.

Figure 6:
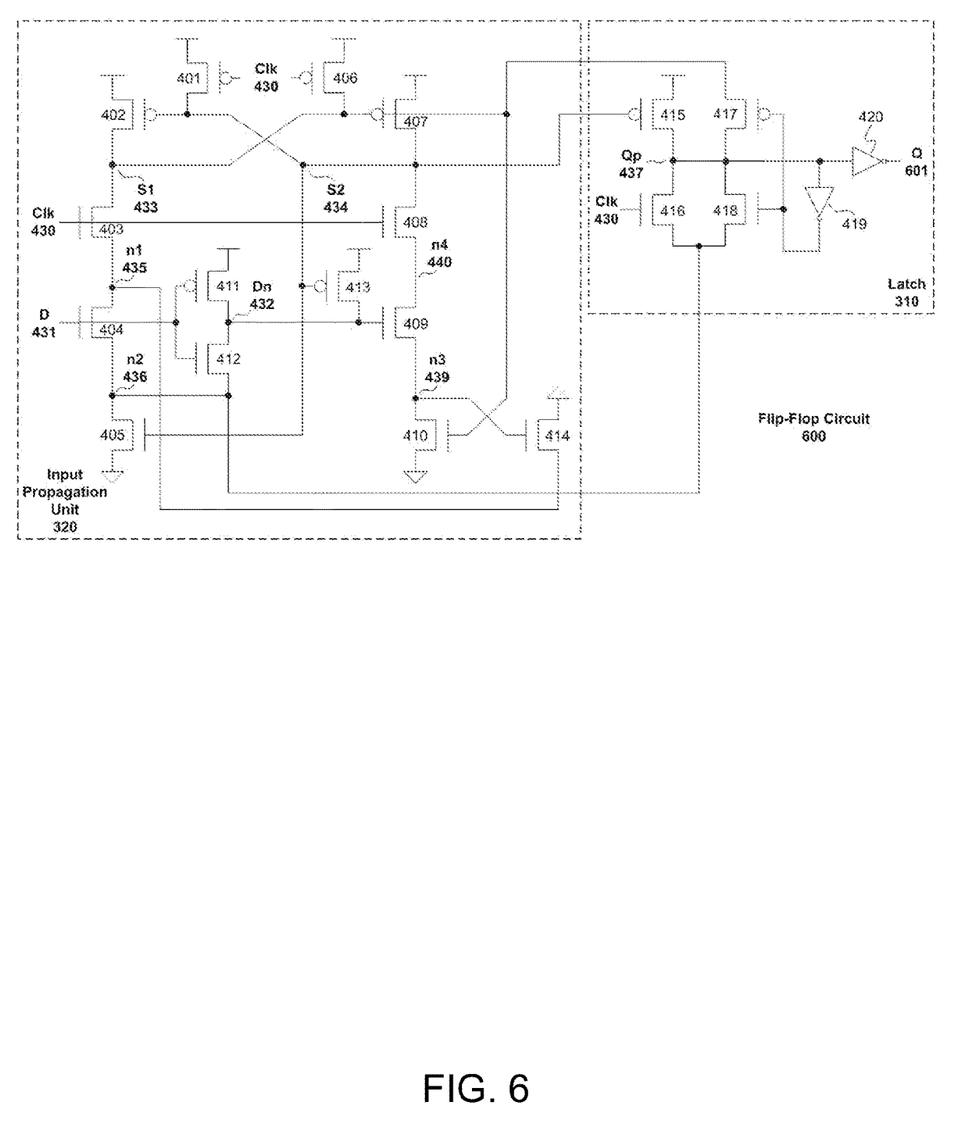
FIG. 6 depicts an embodiment of a flip-flop circuit where the output signal Q has the same polarity as the main input signal.

Referring now to FIG. 6, is a flip-flop circuit 600 illustrating another embodiment of the flip-flop circuit 400, according to an illustrative implementation. Flip-flop circuit 600 resembles similar features and functionality, described in detail with reference to FIG. 4. In particular, unless otherwise noted, like components and elements (e.g., transistors, nodes, signals, etc.) are indicated with like referenced numerals. The operation and behavior of flip-flop circuit 600 is similar to flip-flop circuit 400 except for the following differences to enable an output signal Q 601 with the same polarity as the main input signal D 431. The connectivity of transistors 415 to 418 within latch 310 to the input propagation unit 310 differs. The second top node S2 434 is the output of the input propagation unit 310, and is the first input to the tristate driver of latch 310. The gate terminal of transistor 415 is coupled to second top node S2 434. The second input to the tristate driver remains the clock signal Clk 430. The source terminals of transistors 416 and 418 are coupled to first bottom node n2 436. The source terminal of transistor 417 is coupled to the first top node S1 433. When the main input signal D 431 is at first level and the clock signal Clk 430 transitions from first level to second level, the inverted main input signal Dn 432 activates transistor 409 to discharge the second top node S2 434 of the second stack structure, thereby, activating transistor 415 to pull-up storage node Qp 437 to second level. Output buffer 420 generates an output signal Q 601 aligned with the polarity of the main input signal D 431 at first level.

Figure 7:
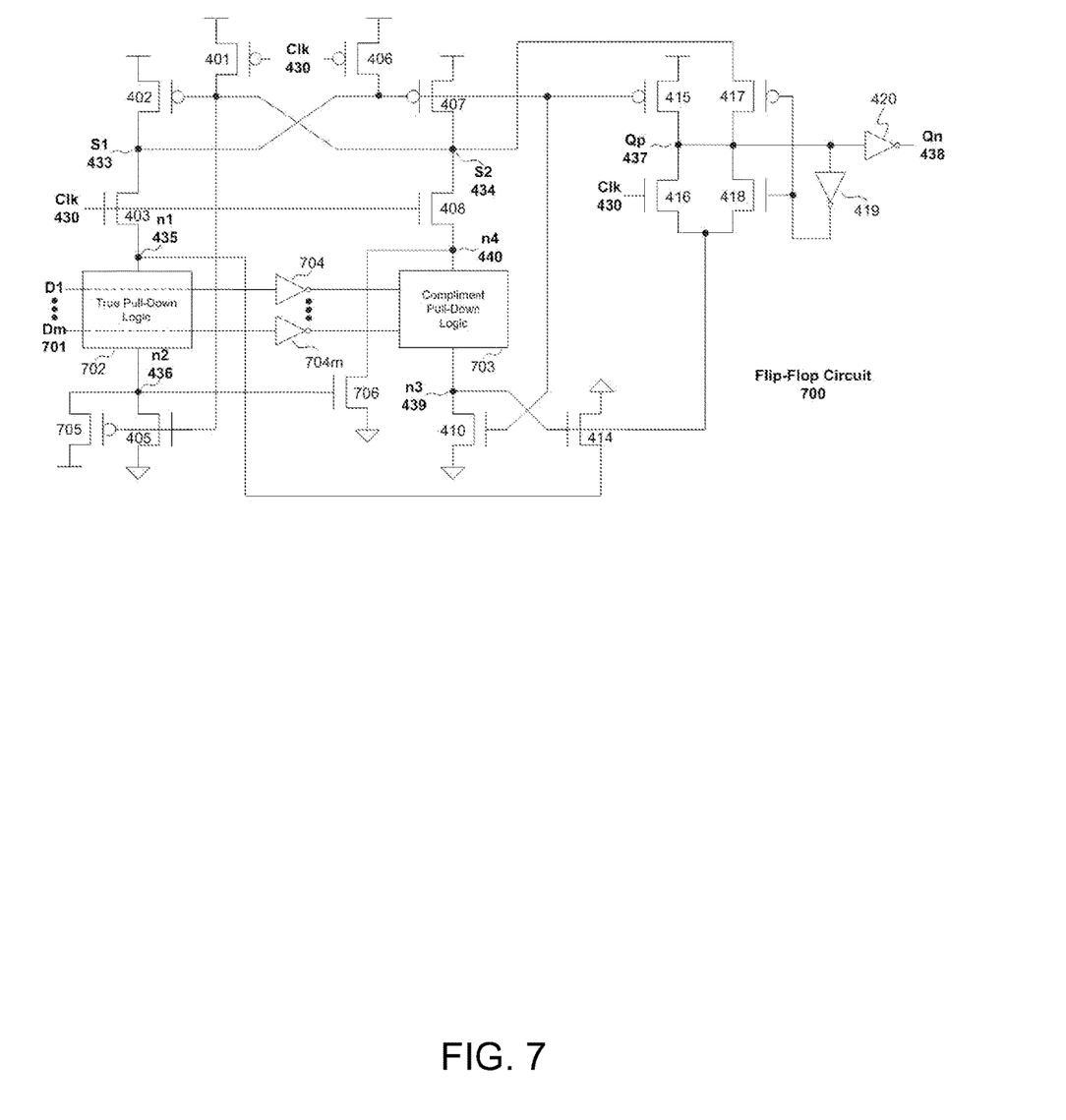
FIG. 7 depicts an embodiment of a flip-flop circuit which incorporates multi-input logic into the stack structures.

Referring now to FIG. 7, is a flip-flop circuit 700 illustrating another embodiment of the flip-flop circuit 400, according to an illustrative implementation. Flip-flop circuit 700 resembles similar features and functionality, described in detail with reference to FIG. 4. In particular, unless otherwise noted, like components and elements (e.g., transistors, nodes, signals, etc.) are indicated with like referenced numerals. The operation and behavior of flip-flop circuit 700 is similar to flip-flop circuit 400 except for the following differences to incorporate multi-input logic into the first and second stack structures. Referring to FIG. 5, the input stage 502 contains the transistor logic tree to implement the desired embedded logic function for flip-flop circuit 700. The true N-pull-down logic is placed into block 702 of FIG. 7. The compliment pull-down logic corresponding to the P-pull-up network of the logic tree is implemented with N-type transistors and placed into block 703 of FIG. 7. As an example of incorporating a 2-input NAND logic into flip-flop circuit 700, the two series-coupled NFETs of the pull-down network are inserted into block 702. The two parallel-coupled PFETs of the pull-up network are replaced by two parallel-coupled NFETs and placed into block 703. The output buffer 420 generates an output signal Qn 438 equal to the logic $(\overline{D1 \cdot D2})$ where D1 is the first main input signal Dm 701 and D2 is the second main input signal Dm 701. Replacing transistor 409 of FIG. 4 with block 703 in the second stack structure requires modifying the second keeper device. Transistor 413 of FIG. 4 is replaced by transistor 706 of FIG. 7. Inverter 704 replaces transistors 411 and 412 of FIG. 4. The drain terminal of transistor 706 is coupled to intermediate node n4 440 of the second stack structure. The gate terminal of transistor 706 is coupled to intermediate node n2 436 of the first stack structure. The source terminal of transistor 706 is coupled to low-power supply. Transistor 706 is activated by transistors 705 and 405 that form an inverter gate with intermediate node n2 436 as the output of the inverter gate. The input of the inverter gate is coupled to the second top node S2 434. Upon discharging the second stack structure, the inverter gate activates transistor 706 using full-rail drive. The series-coupling of block 702 to transistor 403 produces a chain of multiple series-coupled NFETs that deteriorates the $(V_{DD}-V_T)$ drive of transistor 706 if transistor 705 is not added to the flip-flop circuit 700. Therefore, the second top node S 434 has an alternative low-impedance path to low-power supply should any main input signals Dm 701 change while the clock signal Clk 430 remains at second level.

Figure 8:
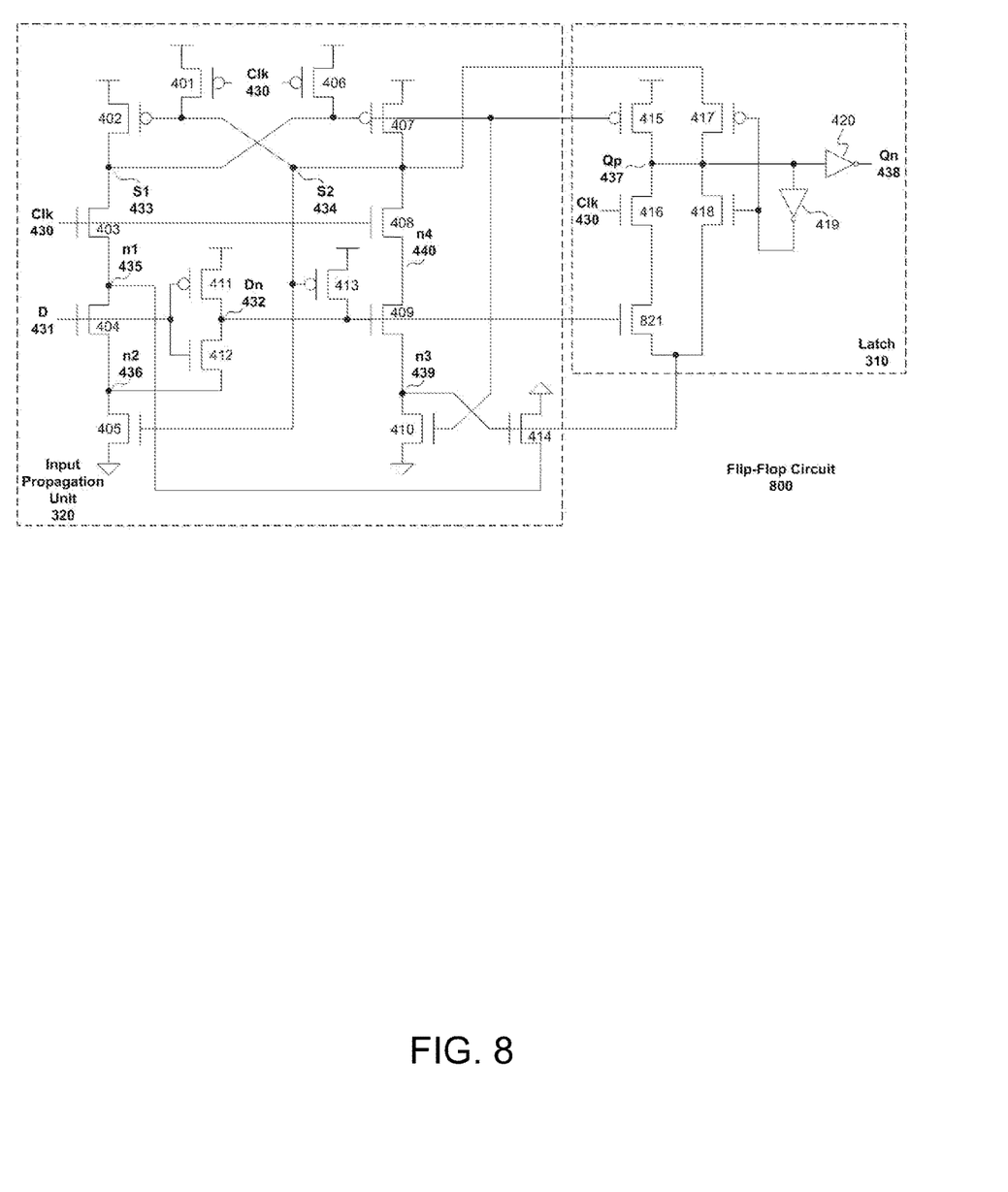
FIG. 8 depicts another embodiment which incorporates input-gating to eliminate voltage droop at the storage node.

Referring now to FIG. 8, is a flip-flop circuit 800 illustrating another embodiment of the flip-flop circuit 400, according to an illustrative implementation. Flip-flop circuit 800 resembles similar features and functionality, described in detail with reference to FIG. 4. In particular, unless otherwise noted, like components and elements (e.g., transistors, nodes, signals, etc.) are indicated with like referenced numerals. The operation and behavior of flip-flop circuit 800 is similar to flip-flop circuit 400 except for the following differences to allow input-gating of the tristate driver within latch 310. The circuit architecture of latch 310 permits storage node Qp 437 to speculatively discharge when the clock signal Clk 430 transitions from first level to second level and the main input signal D 431 is at constant second level. As transistor 410 is activated prior to the rising edge of the clock signal Clk 430, storage node Qp discharges immediately upon the activation of transistor 416. A finite time exists for the first stack structure to discharge first top node S1 433 to deactivate transistor 410 and to activate transistor 415 to recover the storage node Qp 437 to second level. The finite time causes a voltage droop at storage node Qp 437, thereby resulting in additional dynamic power. As the pull-down network of the tristate driver is not in the critical path timing of the flip-flop circuit 800, transistor 821 is inserted between transistors 416 and the second bottom node n3 439 to input-gate the pull-down network of the tristate driver. The gate terminal of transistor 821 is coupled to inverted main input signal Dn 432. The drain terminal of transistor 821 is coupled to the source terminal of transistor 416. The source terminal of transistor 821 is coupled to the source terminal of transistor 418. Both source terminals of transistors 821 and 418 are coupled to the second bottom node n3 439. The input-gating technique disables the speculative discharge nature of latch 310 as storage node Qp 437 only discharges if the main input signal D 431 is at first level, thereby improving the dynamic power performance of the flip-flop circuit 800 during periods of low input activity.

Figure 9:
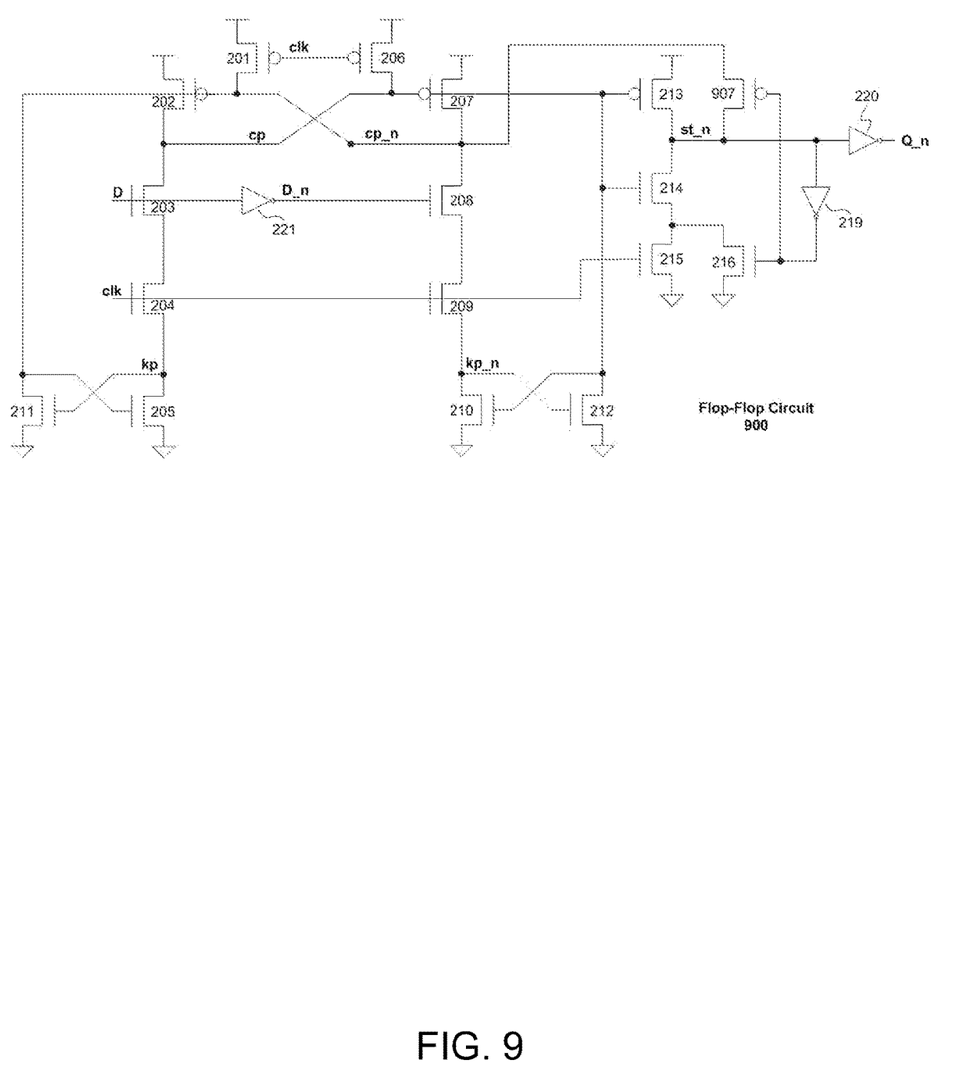
FIG. 9 depicts the method to reduce circuit elements applied to a prior art.

Referring now to FIG. 9, is a flip-flop circuit 900 illustrating the method to reduce circuit elements applied to the prior art of FIG. 2, according to an illustrative implementation. Flip-flop circuit 900 resembles similar features and functionality, described in detail with reference to FIG. 2. In particular, unless otherwise noted, like components and elements (e.g., transistors, nodes, signals, etc.) are indicated with like referenced numerals. The operation and behavior of flip-flop circuit 900 is similar to the circuit of FIG. 2 except for the following differences. Transistor 217 of FIG. 2 is replaced by transistor 907. The functionality of transistor 907 is identical to transistor 217 which is merely renamed in FIG. 9 to highlight the methodology of reducing circuit elements by merging transistors with common functionality. To this end, transistor 218 of FIG. 2 is eliminated and the source terminal of transistor 907 is coupled to the drain terminal of transistor 201. The overall speed performance and functionality of flip-flop circuit 900 are the same with the prior art, however, with improvement to power consumption due to the reduction of one circuit element.

Figure 10:
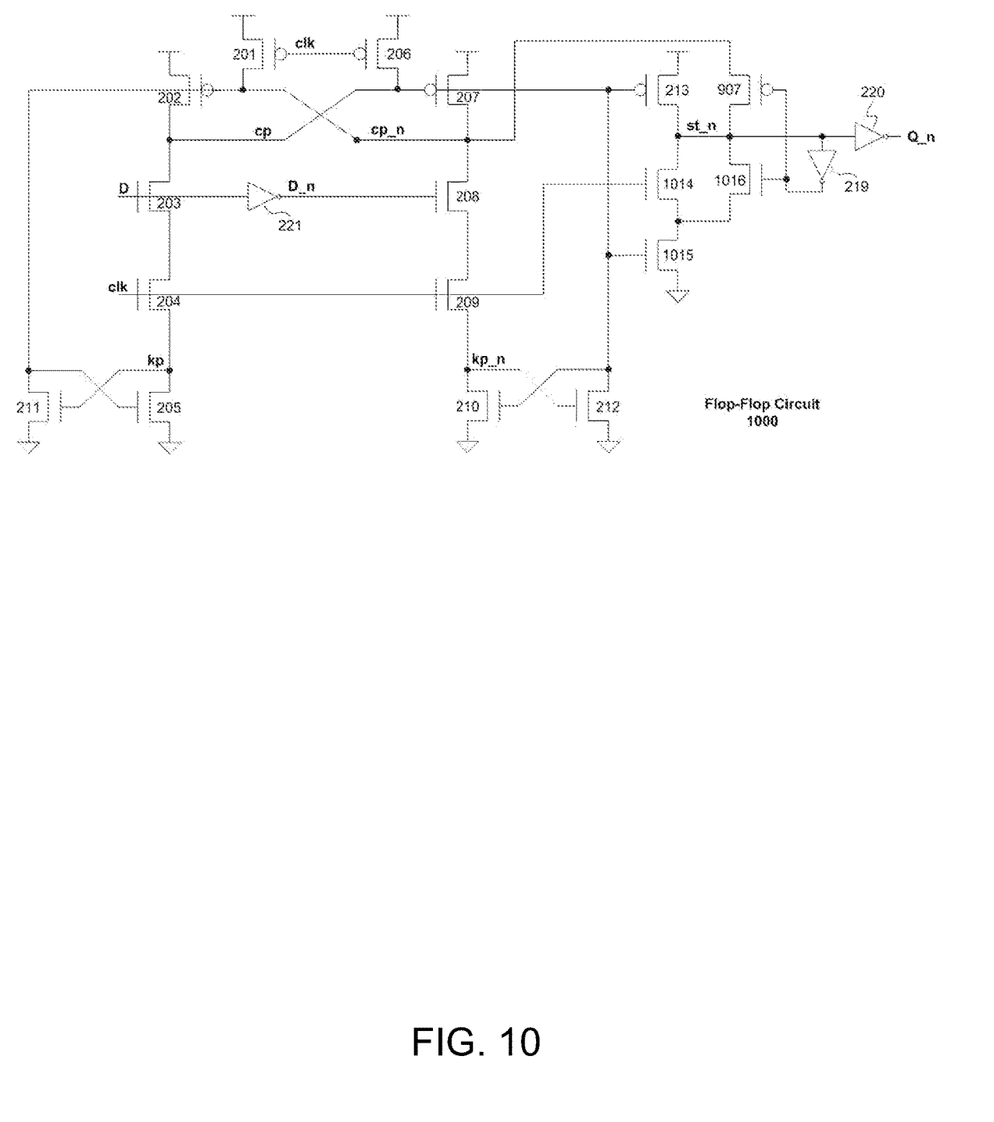
FIG. 10 depicts the method to reduce circuit elements applied to a variation of a prior art.

Referring now to FIG. 10, is a flip-flop circuit 1000 illustrating the method to reduce circuit elements applied to the prior art of FIG. 2, according to an illustrative implementation. Flip-flop circuit 1000 resembles similar features and functionality, described in detail with reference to FIG. 2 and FIG. 9. In particular, unless otherwise noted, like components and elements (e.g., transistors, nodes, signals, etc.) are indicated with like referenced numerals. The operation and behavior of flip-flop circuit 1000 is similar to the flip-flop circuit 900 of FIG. 9 except for the following differences. An alternative topology for the pull-down network of the latch is illustrated in FIG. 10. Transistors 214, 215, and 216 of FIG. 9 are rearranged into different positions relative to each other. Transistor 214 of FIG. 9 is mapped into transistor 1015 of FIG. 10. Transistor 215 of FIG. 9 is mapped into transistor 1014 of FIG. 10. Transistor 216 of FIG. 9 is mapped into transistor 1016 of FIG. 10. Transistor 907 of FIG. 10 applies the same method of reducing circuit elements from FIG. 9. The gate terminal of transistor 1014 is coupled to the clock signal clk; the drain terminal is coupled to the storage node st_n; and the source terminal is coupled to the drain terminal of transistor 1015. The gate terminal of transistor 1015 is coupled to first top node cp and the source terminal is coupled to low-power supply. The drain terminal of transistor 1016 is coupled to the storage node st_n and the source terminal is coupled to the drain terminal of transistor 1015. Only the connectivity to transistors 1014, 1015, and 1016 differs from FIG. 9 while the operation of the flip-flop circuit 1000 is identical to that of FIG. 9. The speed and power performances remain similar to those of FIG. 9.

The invention claimed is:

1. A flip-flop circuit, comprising:
an input terminal for receiving a main input signal;
a clock terminal for receiving a clock signal;
an output terminal for sending an output signal; and
an input propagation unit comprising:
a first clock-activated transistor as the first top-most transistor of a first stack structure; wherein said first stack structure comprises of series-coupled transistors with said first clock-activated transistor being a first top-most transistor, a first data transistor being a first middle-most transistor, a first foot transistor being a first bottom-most transistor;
a second clock-activated transistor as the second top-most transistor of a second stack structure; wherein said second stack structure comprises of series-coupled transistors with said second clock-activated transistor being a second top-most transistor, a second data transistor being a second middle-most transistor, a second foot transistor being a second bottom-most transistor;
a first top node;
a second top node;
a first bottom node;
a second bottom node;
a first keeper device;
a second keeper device; and
a latch, wherein said latch having at most one clock-activated transistor and wherein said latch couples to either said first top node and said second top node, or said first bottom node and said second bottom node and wherein said latch is coupled to said first keeper device of said input propagation unit;
wherein said first keeper device is activated upon the discharging of said first top node to low power supply, wherein said second keeper device is activated upon the discharging of said second top node to said low power supply.

2. The flip-flop circuit of claim 1, wherein said first top node and said second top node are charged to second level when said clock signal is at first level, and wherein said first bottom node and said second bottom node are discharged to first level when said clock signal is at first level.

3. The flip-flop circuit of claim 1, wherein said first top node is coupled to the first top-most transistor and said second top node is coupled to the second top-most transistor.

4. The flip-flop circuit of claim 1, wherein said first clock-activated transistor and said second clock-activated transistor reduce a quantity of intermediate nodes within said first stack structure and said second stack structure from toggling when said main input signal is constant, eliminate contention at said first top node and said second top node when said clock signal transitions to first level, and reduce charge sharing between said first top node and said second top node and intermediate nodes of the first and second stack structures when the clock signal is at first level.

5. The flip-flop circuit of claim 1, wherein said latch comprises at most one clock-activated transistor and merges the pull-up functionality of the pull-up transistor from the keeper sub-circuit with either said first top node or said second top node.

6. The flip-flop circuit of claim 1, wherein said first stack structure and said second stack structure are configured to receive multi-input logic.

7. The flip-flop circuit of claim 1, wherein said latch further comprises:
a tristate driver to receive a first input from an output of the input propagation unit and a second input from said clock signal;
a keeper sub-circuit to maintain said storage node at constant level when said clock signal is at first level; and
an output buffer to isolate the storage node's output;
wherein said tristate driver writes said first input to a storage node when said clock signal is at second level.

8. The flip-flop circuit of claim 1, wherein said latch further comprises a tristate driver, which includes a third clock-activated transistor configured as a pull-down network coupled to either said first bottom node or said second bottom node.

9. The flip-flop circuit of claim 1, wherein said first data transistor is the first top-most transistor of the first stack structure and said second data transistor is the second top-most transistor of said second stack structure.

10. A flip-flop, comprising:
an input terminal for receiving a main input signal;
a clock terminal for receiving a clock signal;
an output terminal for sending an output signal;
an input propagation unit comprising:
a first clock-activated transistor as the first top-most transistor of a first stack structure;
a second clock-activated transistor as the second top-most transistor of a second stack structure;
a first top node;
a second top node;
a first bottom node;
a second bottom node;
a first keeper device;
a second keeper device; and
a latch, wherein said latch having at most one clock-activated transistor and wherein said latch couples to either said first top node and said second top node, or said first bottom node and said second bottom node and wherein said latch is coupled to said first keeper device of said input propagation unit;
wherein said first keeper device comprises of a transistor coupled to a node between the first top-most transistor and the first middle-most transistor, and said second keeper device comprises a transistor coupled to the second middle-most transistor;

wherein said first keeper device is activated upon the discharging of said first top node to low power supply; and wherein said second keeper device is activated upon the discharging of said second top node to said low power supply.

11. The flip-flop circuit of claim 10, wherein the activation of said first keeper device and said second keeper device is independent of changes in said main input signal when said clock signal is at second level.

12. The flip-flop circuit of claim 10, wherein said first keeper device is configured to enable said first top node with an alternative low-impedance path to said low power supply when said main input signal changes while said clock signal remains at second level, and said second keeper device is configured to maintain a primary low-impedance path to said low power supply for said second top node when said main input signal changes while said clock signal remains at second level.

13. The flip-flop circuit of claim 10, wherein said first top node and said second top node are charged to second level when said clock signal is at first level, and wherein said first bottom node and said second bottom node are discharged to first level when said clock signal is at first level.

14. The flip-flop circuit of claim 10, wherein said first top node is coupled to the first top-most transistor and said second top node is coupled to the second top-most transistor.

15. The flip-flop circuit of claim 10, wherein said first clock-activated transistor and said second clock-activated transistor provide reduction in a quantity of intermediate nodes within said first stack structure and said second stack structure that toggle when said main input signal is constant, eliminate contention at said first top node and said second top node when said clock signal transitions to first level, and reduce charge sharing between said first top node and said second top node and intermediate nodes of the first and second stack structures when the clock signal is at first level.

16. The flip-flop circuit of claim 10, wherein said latch comprises at most one clock-activated transistor and merges the pull-up functionality of the pull-up transistor from the keeper sub-circuit with either said first top node or said second top node.

17. The flip-flop circuit of claim 10, wherein said first stack structure and said second stack structure are configured to receive multi-input logic.

18. The flip-flop circuit of claim 10, wherein said latch further comprises:
a tristate driver to receive a first input from an output of the input propagation unit and a second input from said clock signal;
a keeper sub-circuit to maintain said storage node at constant level when said clock signal is at first level; and
an output buffer to isolate the storage node's output;
wherein said tristate driver writes said first input to a storage node when said clock signal is at second level.

19. The flip-flop circuit of claim 10, wherein said latch further comprises one or both of:
a tristate driver that receives a first input from an output of the input propagation unit and a second input from said clock signal; and/or
a keeper sub-circuit that maintains said storage node at constant level when said clock signal is at first level.

20. The flip-flop circuit of claim 10, wherein said first data transistor is the first top-most transistor of the first stack structure and said second data transistor is the second top-most transistor of said second stack structure.

* * * * *